United States Patent
Ahola et al.

[11] Patent Number: 6,121,846
[45] Date of Patent: Sep. 19, 2000

[54] DIGITAL PHASE COMPARATOR WITHOUT DEAD ZONE

[75] Inventors: Rami Ahola, Helsinki; Harri Kimppa, Salo, both of Finland

[73] Assignee: Nokia Mobile Phones Limited, Espoo, Finland

[21] Appl. No.: 09/321,033

[22] Filed: May 27, 1999

[30] Foreign Application Priority Data

May 29, 1998 [FI] Finland ................................ 981225

[51] Int. Cl.[7] .......................... H03D 13/00; H03L 7/089
[52] U.S. Cl. ........................ 331/27; 327/7; 327/12
[58] Field of Search ........................ 331/25, 27; 327/3, 327/5, 7, 12

[56] References Cited

U.S. PATENT DOCUMENTS

| | | | |
|---|---|---|---|
| 4,020,422 | 4/1977 | Underhill | 327/12 |
| 4,322,643 | 3/1982 | Preslar | 307/528 |
| 4,937,537 | 6/1990 | Nyqvist | 331/17 |
| 5,153,468 | 10/1992 | Jokinen et al. | 307/520 |
| 5,175,510 | 12/1992 | Satomaki | 331/17 |
| 5,315,183 | 5/1994 | Ruotsalainen | 307/511 |
| 5,317,283 | 5/1994 | Korhonen | 331/1 A |
| 5,325,075 | 6/1994 | Rapeli | 332/103 |
| 5,619,171 | 4/1997 | Rijckaert et al. | 331/1 A |
| 5,712,580 | 1/1998 | Baumgartner et al. | 327/12 |

OTHER PUBLICATIONS

Patent Abstracts of Japan JP 9162728A, Jun. 20, 1997.
Patent Abstracts of Japan JP 7147537A Jun. 6, 1995.

*Primary Examiner*—Siegfried H. Grimm
*Attorney, Agent, or Firm*—Perman & Green, LLP

[57] ABSTRACT

A digital phase comparator comprises a first signal input (VCO) and second signal input (REF) as well as a first output (UP+) and second output (DOWN+). It is arranged so as to produce an output pulse (503, 504) to the first output and second output per each of the cycles of the periodic signals (501, 502) brought to the first signal input and second signal input. The duration of the output pulse produced to the first output is longer than the duration of the output pulse produced to the second output when the phase of the periodic signal brought to the first signal input is lagging with respect to the phase of the periodic signal brought to the second signal input. Correspondingly, the duration of the output pulse produced to the first output is shorter than the duration of the output pulse produced to the second output when the phase of the periodic signal brought to the first signal input is leading with respect to the phase of the periodic signal brought to the second signal input. The phase comparator is arranged so as to make the starting times of the output pulses produced to the first output and second output substantially simultaneous.

4 Claims, 5 Drawing Sheets

DIGITAL PHASE COMPARATOR WITHOUT DEAD ZONE

TECHNOLOGICAL FIELD

The invention relates in general to digital phase comparators and their use in a phase-locked loop and in a radio apparatus utilizing one. In particular the invention relates to making a dig,ital phase comparator more sensitive to small phase changes.

BACKGROUND OF THE INVENTION

The phase-locked loop is one of the fundamental parts in nearly all modern radio apparatus. FIG. 1 shows a high-frequency frequency synthesizer which produces an oscillating signal at a desired frequency such that the phase of the signal is in known relation to the phase of a certain reference signal. A programmable digital divider 101 has two input signals one of which is generated, in a manner described later on, from an oscillating output signal produced by the circuit and the other is a reference signal REF. In the divider 101 the input signals are divided by pre-programmed divisors. The resulting lower-frequency signals are taken to a phase comparator 102 which has two outputs UP and DOWN. The phase comparator 102 usually produces one output pulse per each input signal cycle. If the phase of the signal brought to the first input of the phase comparator 102 lags with respect to the phase of the signal brought to the second input, the phase comparator generates an UP output pulse and, correspondingly, if the phase of the signal brought to the first input leads with respect to the phase of the signal brought to the second input, the phase comparator generates a DOWN output pulse. These pulses control a charge pump 103 the output of which is connected to a loop filter 104. The operation of the charge pump 103 depends on the control pulses brought to it such that in response to an UP pulse the charge pump sources electric current to the loop filter and in response to a DOWN pulse it sinks electric current from the loop filter. The amount of electric charge sourced or sunk by the charge pump is in proportion to the width of the control pulse brought to it.

It is the task of the loop filter 104 to smooth the fluctuations caused by the alternately increasing and decreasing electric charge into a direct-voltage signal by means of which it controls a voltage-controlled oscillator (VCO) 105. The greater the charge pumped by the charge pump 103 to the loop filter 104, the higher the voltage used to control the oscillator and the higher the frequency of the oscillating signal generated by the oscillator. Similarly, sinking of current to the charge pump 103 as a result of a DOWN pulse decreases the voltage level of the DC control signal produced by the loop filter 104 and thus decreases the frequency of the oscillating signal generated by the oscillator 105. The oscillating signal is the output signal of the circuit. It is also taken to a predivider 106 which produces the first input signal to the programmable digital divider 101. The predivider 106 scales the output signal to a suitable frequency range so that it can be further divided in the programmable digital divider 101 in such a manner that the frequency of the output signal produced can be selected.

A usual disadvantage of the circuit depicted in FIG. 1 is its limited sensitivity to rely small phase differences. Assuming that the input signals brought to the phase comparator 102 differ from each other only a little, the phase comparator should (generate an UP or DOWN pulse the length of which would ideally be near zero. However, it is difficult to produce very short control pulses, so in practice there is around the exact correct phase a so-called dead zone, i.e. a zone of small phase errors where the phase comparator produces no control pulse to the charge pump and, hence, the control signal of the voltage-controlled oscillator is not changed. The dead zone causes that the frequency and phase of the output signal of the circuit may vary randomly within the dead zone, which is functionally disadvantageous.

From U.S. Pat. No. 4,322,643 (to Preslar) it is known a phase comparator according to FIG. 2, which partly eliminates the problem of the dead zone. The idea is to use an internal delay line 201 in the phase comparator so that both the UP and DOWN pulses have a certain minimum length. So, the phase comparator generates both an UP and DOWN pulse per each input signal cycle. If the phase of the first input signal lags with respect to the phase of the second input signal, the phase comparator produces a minimum-length DOWN pulse and an UP pulse the length of which equals the minimum length plus an amount proportional to the phase difference. Similarly, if the phase of the first input signal leads the phase of the second input signal, the phase comparator produces a minimum-length UP pulse and a DOWN pulse the length of which equals the minimum length plus an amount proportional to the phase difference. Both the UP and DOWN output pulses control charge pumps 202 and 203 of their own. The charge pump signals are combined before being taken to an integrator 204 which in practice is the same as the loop filter 104 shown in FIG. 1. So, part of the current produced by one charge pump is always directed to the other charge pump and only the current "left over" is directed to the integrator.

FIG. 3 illustrates the relationship between input signal phase difference and output pulses. Curve 301 represents a first input signal, curve 302 a second input signal. curve 303 the UP output pulses and curve 304 represents the DOWN output pulses. Curves 301 and 302 show that initially the phase of the first input signal lag,s with respect to the phase of the second input signal, then for one cycle the phase difference is zero and then the phase of the first input signal leads with respect to the phase of the second input signal. Curves 303 and 304 show that before the turn-around of the phase difference the length of the UP output pulses exceeds the minimum length and, correspondingly, after the turn-around of the phase difference the length of the DOWN output pulses exceeds the minimum length. Note that in Preslar's arrangement the output pulse polarity is reverse, i.e. a pulse means a momentary shift from logic 1 to logic 0. It is characteristic of the operation of Preslar's arrangement that the output pulses start at different times but always end simultaneously.

In practice, the arrangement according to FIGS. 2 and 3 has not been found optimal.

SUMMARY OF THE INVENTION

An object of the present invention is to provide a digital phase comparator in which the problem of the dead zone is small or nonexistent. Another object of the invention is to provide a phase-locked loop and radio apparatus which utilize a digital phase comparator in which the problem of the dead zone is small or non-existent.

The objects of the invention are achieved by including in a digital phase comparator a delay arrangement by means of which one of at least two output pulses started simultaneously ends at a certain minimum point and the other lasts after the minimum point for a time proportional to the amount of observed phase difference.

The digital phase comparator according to the invention is characterized in that it is arranged so as to make the start times of the output pulses brought to the first output and second output substantially simultaneous.

The invention is also directed to a phase-locked loop which is characterized in that a digital phase comparator in it is arranged so as to produce an output pulse to the first output and second output per each of the cycles of the periodic signals brought to the first signal input and second signal input so that the duration of the output pulse produced to the first output is longer than the duration of the output pulse produced to the second output when the phase of the first input signal lags with respect to the phase of the second input signal, and the duration of the output pulse produced to the first output is shorter than the duration of the Output pulse produced to the second output when the phase of the first input signal leads with respect to the phase of the second input signal, and make the starting times of the output pulses produced to the first output and second output substantially simultaneous.

In addition, the invention is directed to a radio apparatus characterized in that the phase-locked loop is in accordance with the description above.

In accordance with the invention, a digital phase comparator produces both an UP pulse and a DOWN pulse per each input signal cycle. UP and DOWN pulses mean generally any signals that have limited amplitude and duration, the signal known as the UP pulse indicating a phase difference between input signals in a first direction, and the signal known as the DOWN pulse indicating a phase difference between input signals in a second direction. In phase difference detection, the amplitude and/or duration of the UP and DOWN pulses indicates the amount of phase difference.

In the arrangement according to the invention the UP and DOWN pulses, or the output pulses, start simultaneously at a certain edge of the input pulse the phase of which is leading. A delayed copy of the same input pulse edge ends the first output pulse. The corresponding edge of the input pulse the phase of which is lagging is delayed in the same maliner, so that its delayed copy ends the second output pulse.

A preferred embodiment for the practical realization of the principle described above comprises two S/R flip-flops, two D flip-flops, two equally long delay lines, and two logic gates. The first logic late is an OR gate to take the rising edge of the first arriving input pulse as a clock pulse to both D flip-flops regardless of the input line through which the pulse arrived. Then both D flip-flops set the respective S/R flip-flops. Pulses coming through both input lines are delayed in their own delay lines independent of each other, so that the delayed copy of the rising edge of the first input pulse resets the first S/R flip-flop and the delayed copy of the rising edge of the second input pulse resets the second S/R flip-flop. The output pulses are then obtained from the outputs of the S/R flip-flops. The second logic gate is used to liiitialize the D flip-flops before the next cycle in the input signals. In addition, the outputs of both S/R flip-flops are directed to the reset inputs of the D flip-flops controlling them in order to avoid undefined operation.

It is typical of digital circuits that the polarity of many signals can be changed, falling edges of pulses can be used instead of rising edges, and logic gates or their combinations can be replaced by other logic gates or their combinations without changing the basic functional idea. It is obvious to a person skilled in the art that the above references to rising edges and pulse polarities are exemplary only. The same inventional idea may also be realized in other ways.

BRIEF DESCRIPTION OF DRAWINGS

The invention will now be described in more detail with reference to the preferred embodiments presented by way of example and to the accompanying drawing wherein.

Above in conjunction with the description of the prior art reference was made to FIGS. 1 to 3, so below in the description of the invention and its preferred embodiments reference will be made mainly to FIGS. 4 to 8. Like elements in the Figures are denoted by like reference designators.

DETAILED DESCRIPTION OF THE INVENTION

Figure 4:
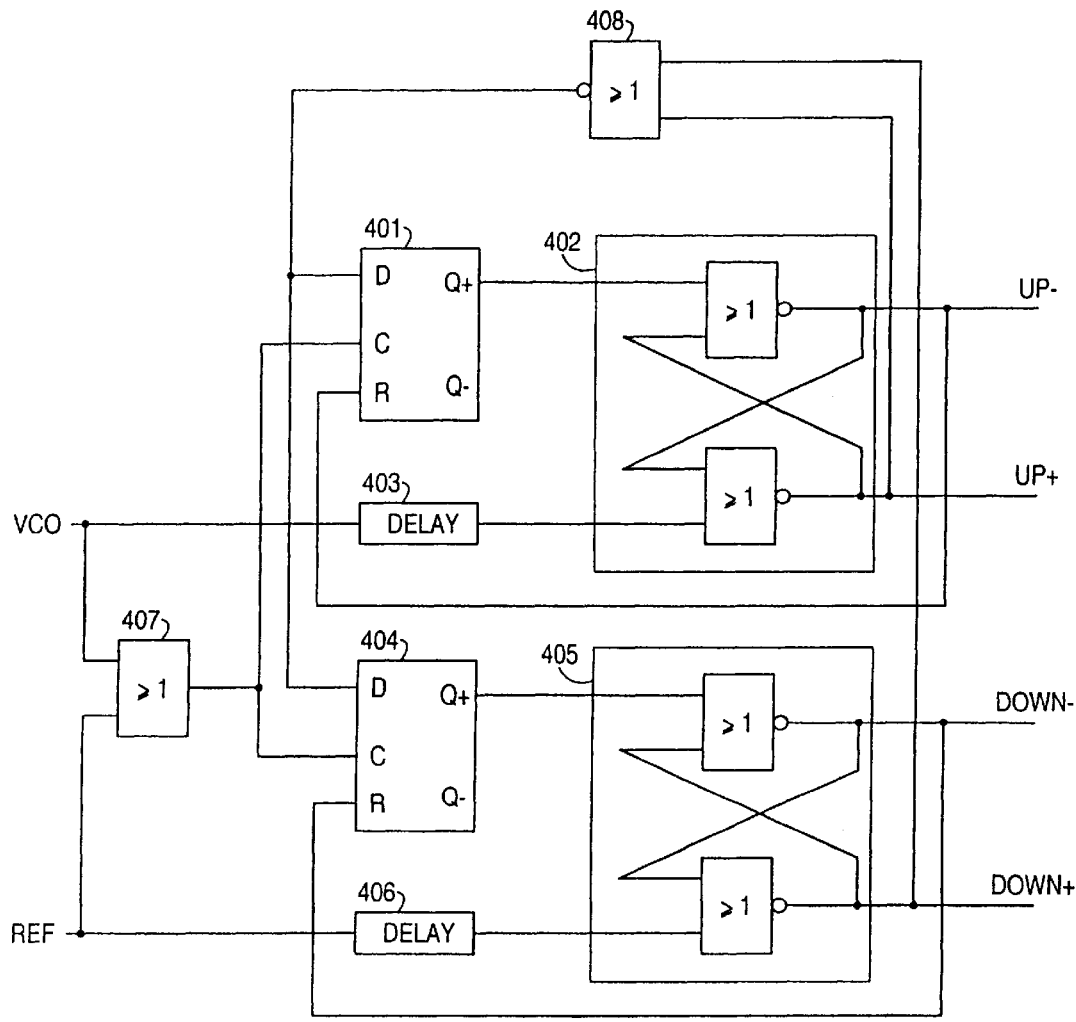
FIG. 4 shows a digital phase comparator according to a preferred embodiment of the invention.

FIG. 4 shows a digital phase comparator 400 according to a preferred embodiment of the invention comprising a first D flip-flop 401, first S/R flip-flop 402, first delay line 403, a second D flip-flop 404, second S/R flip-flop 405, second delay line 406, a first logic gate 407 and a second logic gate 408. The circuit has two inputs the first of which is marked VCO and the second REF, implying that the circuit can be used as an element in a frequency synthesizer such that a signal obtained from the frequency synthesizer output is connected to the first input and a signal obtained from a reference signal is connected to the second input. The circuit has four outputs, of which the first output UP+ and the third output UP− are a complementary pair, and the second output DOWN+ and the fourth output DOWN− are a complementary pair.

The circuit depicted in FIG. 4 is symmetrical with respect to the first and second inputs, so below a detailed description is given only for the portion related to the first input. The first input VCO is connected through the first logic gate 407 to the C input, or clock input, of the first D flip-flop 401. In addition, the first input VCO is connected through the delay line 403 to the R input, or reset input, of the first SIR flip-flop 402. Output Q+, or the output with a positive polarity, of the first D flip-flop is connected to the S input, or set input, of the first S/R flip-flop 402; output Q−, or the output with a negative polarity, of the first D flip-flop is not connected anywhere. The first output of the first S/R flip-flop is also the whole circuit's first output UP+, and the second output of the first S/R flip-flop is also the whole circuit's third output UP−. The first of these, UP+, is connected through the second logic gate 408 to the D input of the first D flip-flop 401. The second output UP− of the first S/R flip-flop is connected to the R input, or reset input, of the first D flipflop 401. The portion of the circuit 400 related to the second input is identical; apart from the logic gates 407 and 408 and S/R flip-flop outputs, the qualifier "first" is replaced by "second". The first output of the second S/R flip-flop is also the whole circuit's second output DOWN+, and the second output of the second S/R flip-flop is also the whole circuit's fourth output DOWN−.

A digital phase comparator according to FIG. 4 operates as follows. Initial situation means a situation where both inputs VCO and REF are in the logic 0 state, i.e. it can be said that the circuit is waiting for input pulses. Then the first output UP+ and second output DOWN+ are in the logic 0 state and their complementary pairs UP+ and DOWN− correspondingly in the logic 1 state. Inside the circuit, the D inputs of both D flip-flops 401 and 404 are in the logic 1 state and outputs Q+ are in the logic 0 state, so that all inputs of the S/R flip-flops 402 and 405 are in the logic 0 state. When a rising edge of a pulse arrives through one of the input lines VCO or REF, the OR gate 407 produces a positive clock edge to both D flip-flops 401 and 404. Then outputs Q+ of both D flip-flops 404 and 404 go to the logic 1 state, which sets both S/R flip-flops 402 and 405, The circuit's first output UP+ and second output DOWN+ go then to the logic 1 state, i.e. an UP pulse and DOWN pulse start simultaneously at the output of the digital phase comparator 400.

Let us assume that the above-mentioned rising edge of a pulse arriving thorough an input line arrived through the first input line VCO, i.e. the phase of the first input signal leads with respect to the phase of the second input signal. The rising edge of the first input signal is delayed in the first delay line 403 for a certain delay, after which the delayed copy of the rising edge of the pulse is directed to the R input of the first S/R flip-flop 402. This resets the first S/R flip-flop, i.e. returns the first output UP+ of the whole circuit to the logic 0 state (and the third output UP− to the logic 1 state), which means the end of the UP output pulse. Resetting the first S/R flip-flop does not, however, affect the operation of the lower portion of the circuit. When a rising edge of a pulse arrives through the second input line REF, a delayed copy of it is generated in the second delay line 406. This delayed copy resets the second S/R flip-flop 405, i.e. returns the second output DOWN+ of the whole circuit to the logic 0 state (and the fourth output DOWN− to the logic 1 state), which marks the end of the DOWN output pulse. The time between the end of the UP output pulse and the end of the DOWN output pulse equals the time between the rising edges of the first and second input pulses brought to the inputs of the circuit provided that the delays generated in delay lines 403 and 406 are equal.

To return the D flip-flops 401 and 404 to the initial state the circuit's first output UP+ and second output DOWN+ are connected via a NOR gate 408 to the D inputs of the D flip-flops 401 and 404. When both outputs have returned to the logic 0 state, the NOR gate 408 returns the D inputs of the D flip-flops 401 and 404 to the logic 1 state.

Operation of an S/R flip-flop is undefined if its both inputs are in the logic 1 state. To avoid this, the negative-polarity outputs of both S/R flip-flops are connected to the R inputs of the D flip-flops controlling the S/R flip-flops. As soon as an S/R flip-flop has changed states, indicating an output pulse, the controlling D flip-flop is reset, returning the S input of the S/R flip-flop to the logic 0 state.

Figure 5:
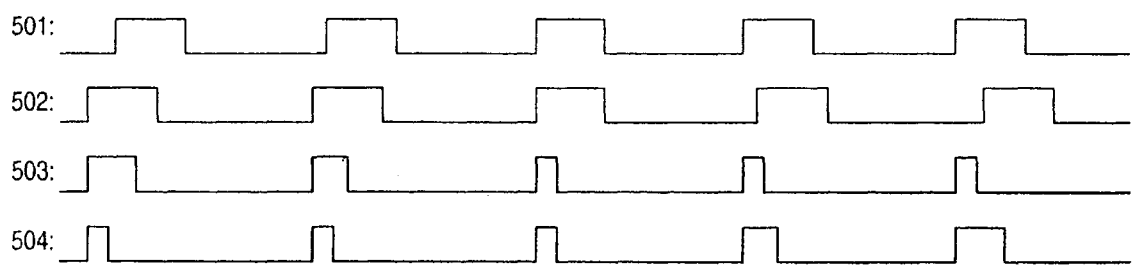
FIG. 5 shows timing of signals in the circuit of FIG. 4.

FIG. 5 illustrates the timing between input and output pulses in the operation of the circuit depicted in FIG. 4. Curve 501 represents the first input signal VCO, curve 502 represents the second input signal REF, curve 503 represents the output pulses in the circuit's first output UP+, and curve 504 represents the output pulses in the circuit's second output DOWN+. The output pulses of the circuit's third and fourth outputs could be easily produced by mirroring curves 503 and 504 with respect to the horizontal axis. Curves 501 and 502 show that the phase of the first input signal VCO is first lagging with respect to the phase of the second input signal REF, then the phase difference is zero for one cycle, and then the phase of the first input signal VCO is leading with respect to the phase of the second input signal REF.

Curves 503 and 504 show that both the UP and DOWN output pulses always have a certain minimum length independent of the sign of the phase difference between the input pulses. Before the phase difference turns into its opposite the length of the UP output pulses exceeds the minimum length and, correspondingly, after the turning of the phase difference the length of the DOWN output pulses exceeds the minimum length. The minimum length is in practice the same as the delay of the rising edge of the input pulse, generated in the delay line 403 or 406.

Curves 503 and 504 also show that the UP and DOWN pulses always start simultaneously but end at different times depending on the sign of the phase difference between the input signals.

Figure 6:
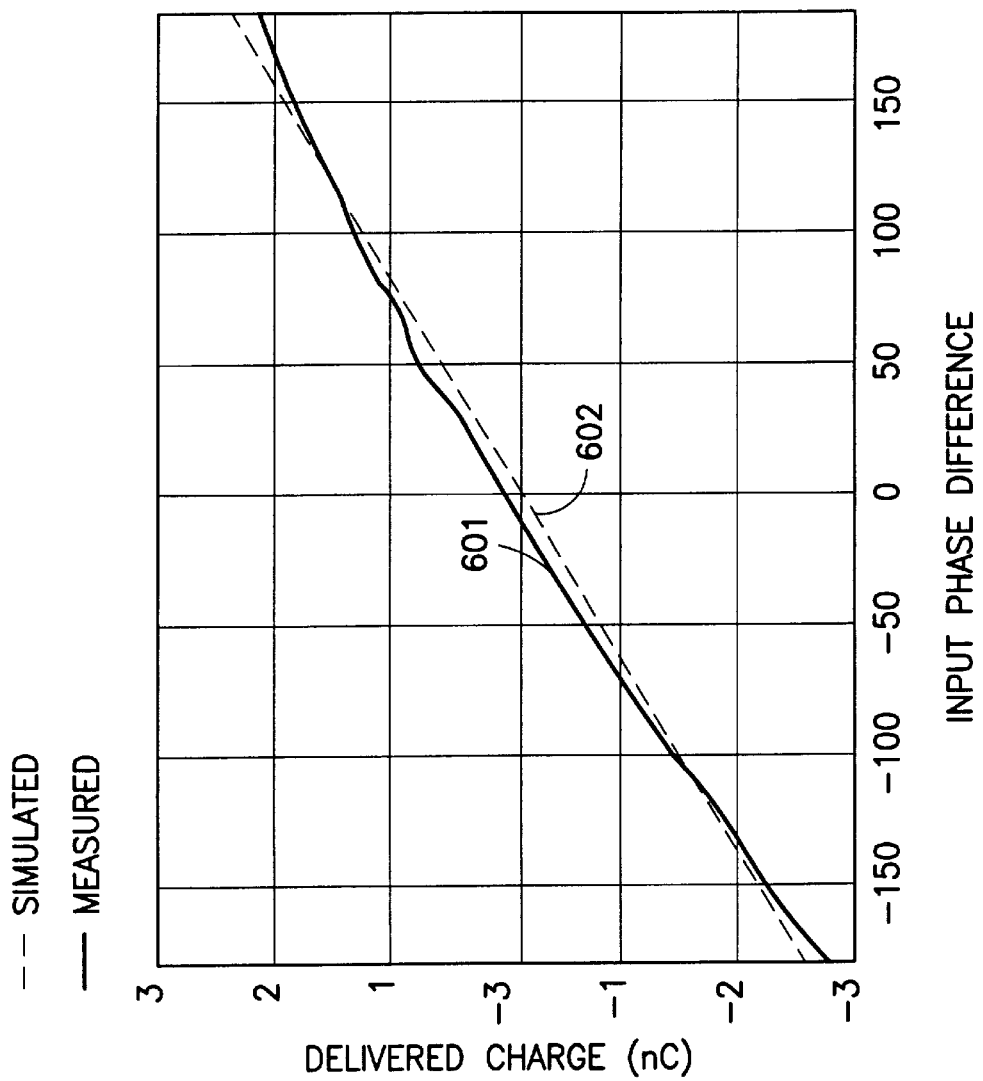
FIG. 6 shows measured and simulated signals from the charge pump as a function of phase difference.

Let us assume that a digital phase comparator according to FIG. 4 controls a known charge pump which has at least two inputs. The charge pump may also have four inputs, in which case all the output signals UP+, UP−, DOWN+, and DOWN− of the digital phase comparator are brought to it. Such a charge pump sources or sinks current, depending on whether it receives an UP pulse or a DOWN pulse. FIG. 6 shows a sourced or sunk charge measured at the charge pump output as a function of the phase difference between input signals received by the digital phase comparator. The vertical axis represents the sourced or sunk charge in nanocoulombs and the horizontal axis represents the phase difference in degrees. The continuous curve 601 represents a measurement result obtained by constructing a digital phase comparator according to FIG. 4 and connecting it to a known charge pump. The broken curve 602 represents a computational simulation obtained by replacing the components of the circuit according to FIG. 4 and known charge pump by their computational models. Curve 601 shows that it has no horizontal portion near the origin of the coordinate system, i.e. at small phase differences, which means that the digital phase comparator according to the invention can fully eliminate the dead zone. The slight curvature of curve 601 is caused by the fact that there is a slight mismatch between the currents sourced and sunk by the charge pump in response to control pulses of the same width.

Figure 1:
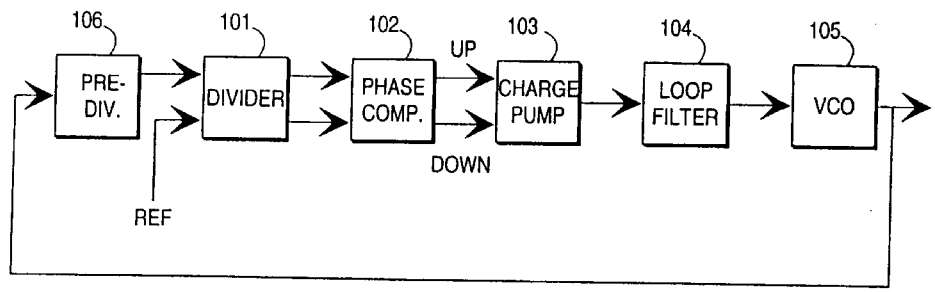
FIG. 1 shows a frequency synthesizer according to the prior art.
Figure 2:
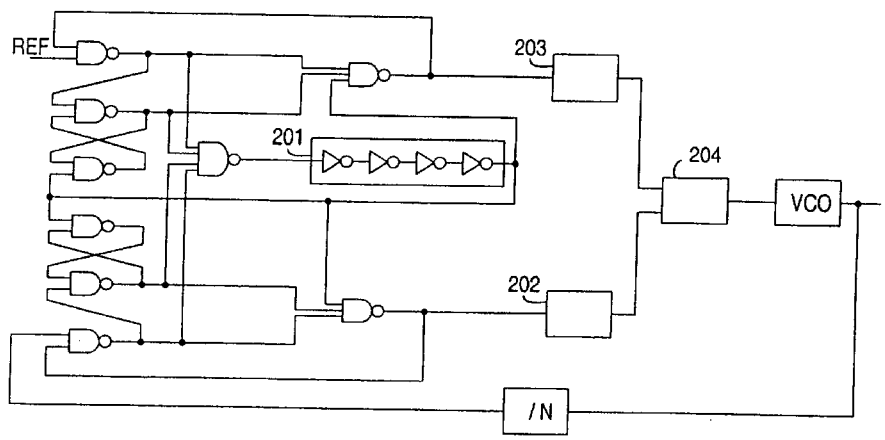
FIG. 2 shows a phase comparator according to the prior art.
Figure 3:
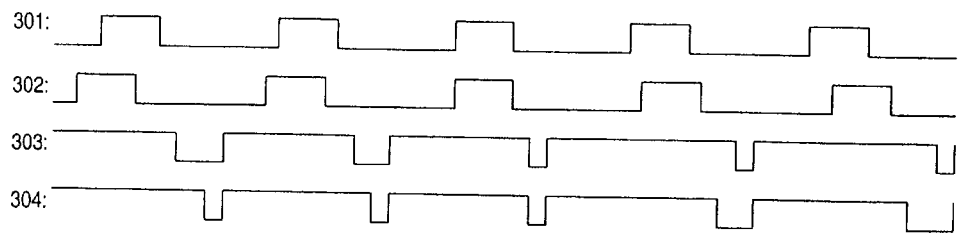
FIG. 3 shows timing of signals in the circuit of FIG. 2.

The invention is applicable to an otherwise known frequency synthesizer according to FIG. 1, thereby achieving an output signal the phase characteristics of which are considerably more stable than what is achieved using prior-art frequency synthesizers.

Figure 7:
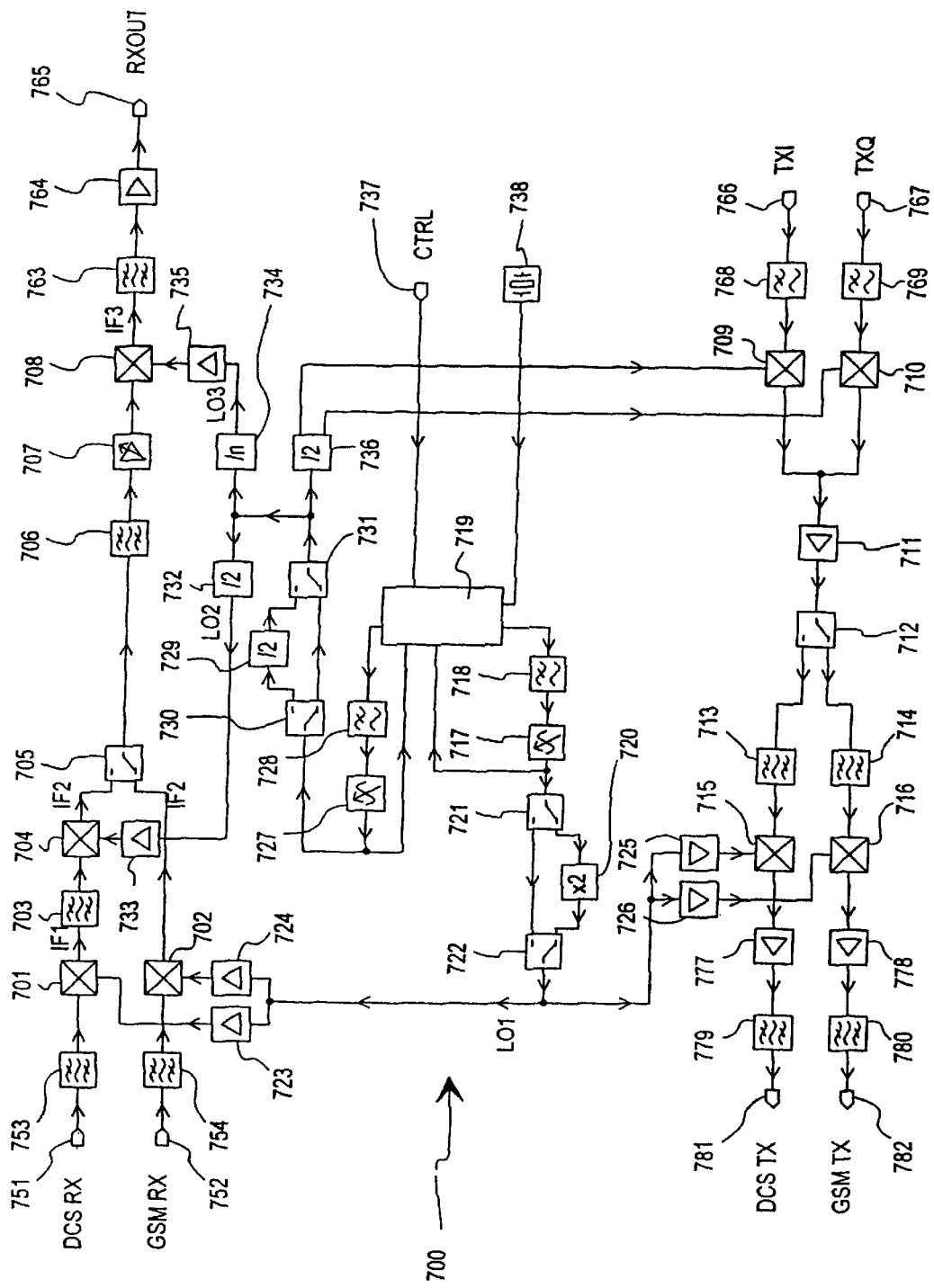
FIG. 7 shows the circuit according to FIG. 4 in a radio apparatus.

FIG. 7 shows a radio apparatus the basic construction of which is known from the Finnish patent application no. FI 974269 in which the applicant is the same as in this application. It is a dual-mode radio transceiver construction wherein the upper portion belongs to the receiver branch and the lower portion to the transmitter branch. A signal of the first frequency band is taken to the apparatus according to FIG. 7 via interface 751, and a signal of the second frequency band via interface 752. Radio-frequency filters 753 and 754 filter the signals in a desired manner. The signal of the first frequency band is mixed to an intermediate frequency in mixer 701 using a mixing frequency which is generated in a manner described later on. Similarly, the signal of the second frequency band is mixed to another intermediate frequency in mixer 702 using the same mixing frequency.

The signal from mixer 701 is filtered by a bandpass-type filter 703 and then mixed to a second intermediate frequency in mixer 704 using a mixing frequency which is generated in a manner described later on. A selection switch 705 is used to select the signal to be taken further to filter 706 and from there via gain control 707 to mixer 708 in which the signal is further mixed to a lower intermediate frequency. The signal is taken through filter 763 and amplifier 764 to interface 765 and from there to a demodulator which may be in accordance with the prior art and is not shown in the drawing.

In the transmitter chain the I and Q signals coming through interfaces 766 and 767 are taken via filters 768 and 769 to mixers 709 and 710 using a mixing frequency generation of which will be described later on. The mixing results are combined and taken to amplifier 711 and from there either to filter 713 or filter 714 depending on the position of selection switch 712. The filtered signal is mixed to the transmit frequency in mixer 715 or 716 and taken via power amplifier 777 and filter 779 or power amplifier 778 and filter 780 to interface 781 or 782 from where it can be further taken via a possible antenna switch and/or duplex filter (not shown) to an antenna (not shown).

To produce the mixing frequencies used in mixers 701, 702, 715 and 716, an ultra-high-frequency voltage-controlled oscillator (UHF-VCO) 717 is used which sets its control signal from control logic 719 via low-pass filter 718 and which has at its output a feedback to the control logic. The frequency of the signal produced by the UHF-VCO 717 can be changed, if necessary, by means of frequency multiplier 720 by connecting it by means of switches 721 and 722 in series with the UHF-VCO 717. In the first position of switches 721 and 722 the mixing frequency produced by the UHF-VCO 717 is taken directly to amplifiers 723, 724 725 and 726 and from there to the corresponding mixers 701, 702, 715 and 716, an in the second position of switches 721 and 722 the mixing frequency produced by the UHF-VCO 717 is taken to said amplifiers via frequency multiplier 720. Frequency multiplier 720 shown in the drawing is a doubler. In addition to the fact that the frequency of the signal produced by the UHF-VCO 717 can be changed by frequency multiplier 720, the UHF-VCO naturally has also an adjustment range which specifies the limits within which the frequency produced by it can be adjusted by means of control signals sent by the control logic 719.

To produce the mixing frequencies used in mixers 704, 708, 709 and 710, a very-high-frequency voltage-controlled oscillator (VHF-VCO) 727 is used which gets its control signal from control logic 719 via low-pass filter 728 and which has at its output a feedback to the control logic in the same manner as the UHF-VCO. A block can be connected in series with the VHF-VCO 727, too, to change the frequency in a simple operation. In FIG. 7 the block in question is a frequency divider 729 that can be taken into use by means of switches 730 and 73 1. Depending on the position of switches 730 and 73 1, the frequency produced by the VHF-VCO is directed either as such or via frequency divider 729 to frequency dividers 732, 734 and 736. The first of these (732) produces a mixing frequency which is taken through amplifier 733 to mixer 704, the second (734) produces a mixing frequency which is taken through amplifier 735 to mixer 708, and the third (736) produces two frequencies out of phase with each other, i.e. so-called I and Q mixing frequencies which are taken to mixers 709 and 710 of an IQ modulator in the transmitter chain.

If in FIG. 7 the UHF-VCO 717 and/or the VIF-VCO 727 is a frequency synthesizer in which the digital phase comparator is in accordance with the invention, the spurious effect caused in the system by VCO phase noise is significantly reduced. FIG. 7 is only an example of how the digital phase comparator according to the invention can be used in a radio apparatus; a person skilled in the art easily finds in a radio apparatus other applications for the invention. Common to all of them is the reduction of phase noise by means of the invention and, thus, better operation especially in systems in which the processing of transmitted data is based on a phase modulation method.

Figure 8:
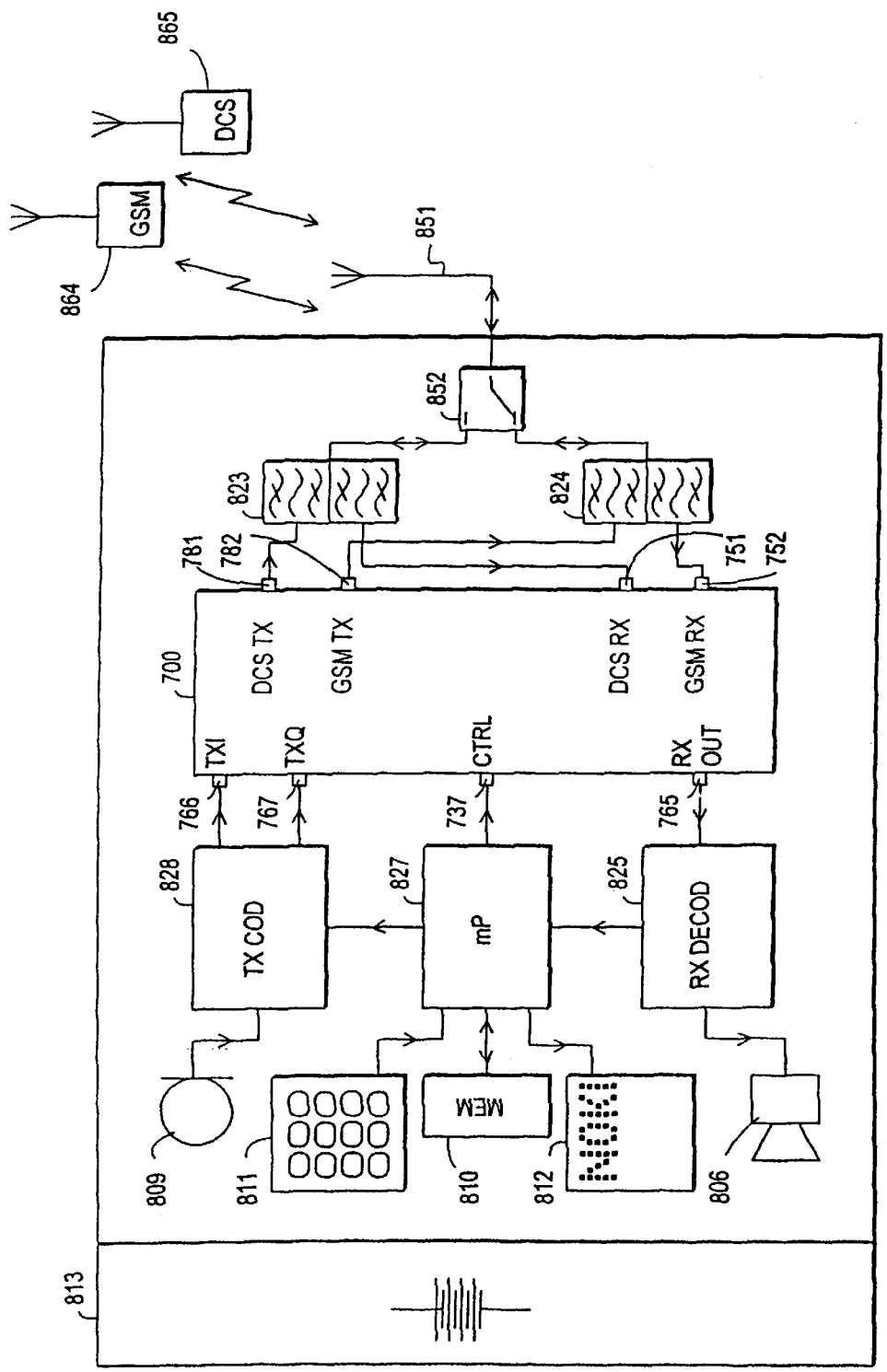
FIG. 8 shows the apparatus of FIG. 7 incorporated in a mobile phone.

FIG. 8 shows by way of example the apparatus 700 according to FIG. 7 incorporated in a mobile phone. A mobile phone 800 comprises an antenna 851 and, connected thereto, a switch 852 to select operation in accordance to one of the frequency bands. The position of the switch 852 is preferably selected by a microprocessor controlling the operation of the mobile phone. The mobile phone 800 comprises two duplex filters 823 and 824 in which a receive-frequency signal received by the antenna 85 1 is directed to the input interfaces 751 and 752 in the receiver chain of the apparatus 700, and the signal coming from the output interfaces 78 1 and 782 in the transmitter chain of the apparatus 700 is directed to the antenna 851. Block 825 connected to the output interface 765 of the receiver chain comprises the normal demodulation and decoding functions to convert the signal given by the apparatus 700 into an analog audio signal which is taken to a loudspeaker 806, and into data signals which are taken to a control block 827. Block 828 connected to the input interfaces 766 and 767 of the transmitter chain comprises the normal coding and other functions to convert the analog audio signal produced by a microphone 809 and the data signals supplied by the control block 827 into digital I and Q bit strings. In addition, the mobile phone 800 comprises memory elements 810, keypad 811, display 812 and a power supply 813.

What is claimed is:

1. A digital phase comparator comprising a first signal input and a second signal input for inputting periodic signals, a first output and a second output for outputting output pulses, means for producing an output pulse to the first output and second output per each cycle of the periodic signals brought to the first signal input and second signal input so that the duration of the output pulse produced to the first output is longer than the duration of the output pulse produced to the second output when the phase of the periodic signal brought to the first signal input is lagging with respect to the of the periodic signal brought to the second signal input, and the duration of the output pulse produced to the first output is shorter than the duration of the output pulse produced to the second output when the phase of the periodic signal brought to the first signal input is leading with respect to the phase of the periodic signal brought to the second signal input;

wherein the digital phase comparator is arranged so as to make the starting times of the output pulses produced to the first output and second output substantially simultaneous.

2. The digital phase comparator of claim 1 comprising a first D flip-flop having a D input, a C input, an R input and an output, a first S/R flip-flop having an S input, an R input, a first output and a second output, a first delay line, a second D flip-flop having a D input, a C input, an R input and an output, a second S/R flip-flop having an S input, an R input, a first output and a second output, a second delay line and a first logic gate and a second logic gate; wherein the first input of the digital phase comparator is coupled via the first logic gate to the C input of the first D flip-flop and via the first delay line to the R input of the first S/R flip-flop, the output of the first D flip-flop is coupled to the S input of the first S/R flip-flop, the first output of the first S/R flip-flop is coupled to the first output of the digital phase comparator and via the second logic gate to the D input of the first D flip-flop, the second output of the first S/R flip-flop is coupled to the R input of the first D flip-flop, the second input of the digital phase comparator is coupled via the first logic gate to the C input of the second D flip-flop and via the second delay line to the R input of the second S/R flip-flop, the output of the second D flip-flop is coupled to the S input of the second S/R flip-flop, the first output of the second S/R flip-flop is coupled to the second output of the digital phase comparator and via the second logic gate to the D input of the second D flip-flop, and the second output of the second S/R flip-flop is coupled to the R input of the second D flip-flop.

3. A phase-locked loop comprising a charge pump and a filter, a voltage-controlled oscillator to produce an output signal of the phase-locked loop, a digital phase comparator to compare a signal produced by the phase-locked loop to an external reference signal, within said digital phase comparator a first signal input to couple a first input signal obtained from the output signal of the phase-locked loop to the digital phase comparator and a second signal input to couple a first input signal obtained from the external reference signal to the digital phase comparator, and also within said digital phase comparator a first output and a second output both arranged so as to control said voltage-controlled oscillator through said charge pump and filter; wherein the digital phase comparator is arranged so as to produce an output pulse to the first output and second output per each cycle of the periodic signals brought to the first signal input and second signal input, so that the duration of the output pulse produced to the first output is longer than the duration of the output pulse produced to the second output when the phase of the first input signal is lagging with respect to the phase of the second input signal, and the duration of the output pulse produced to the first output is shorter than the duration of the output pulse produced to the second output when the phase of the first input signal is leading with respect to the phase of the second input signal, and make the starting times of the output pulses produced to the first output and second output substantially simultaneous.

4. A radio apparatus comprising a frequency synthesizer, within said frequency synthesizer a phase-locked loop, within said phase-locked loop a charge pump and a filter, also within said phase-locked loop a voltage-controlled oscillator to produce an output signal of the phase-locked loop, also within said phase-locked loop a digital phase comparator to compare a signal produced by the phase-locked loop to an external reference signal, within said digital phase comparator a first signal input to couple a first input signal obtained from the output signal of the phase-locked loop to the digital phase comparator and a second signal input to couple a first input signal obtained firm the external reference signal to the digital phase comparator, and also within said digital phase comparator a first output and a second output both arranged so as to control said voltage-controlled oscillator through said charge pump and filter; wherein the digital phase comparator is arranged so as to produce an output pulse to the first output and second output per each cycle of the periodic signals brought to the first signal input and second signal input, so that the duration of the output pulse produced to the first output is longer than the duration of the output pulse produced to the second output when the phase of the first input signal is lagging with respect to the phase of the second input signal, and the duration of the output pulse produced to the first output is shorter than the duration of the output pulse produced to the second output when the phase of the first input signal is leading with respect to the phase of the second input signal, and make the starting times of the output pulses produced to the first output and second output substantially simultaneous.

* * * * *

UNITED STATES PATENT AND TRADEMARK OFFICE
CERTIFICATE OF CORRECTION

PATENT NO. : 6,121,846
DATED : 9/19/00
INVENTOR(S) : Rami Ahola; Harri Kimppa

It is certified that error appears in the above-indentified patent and that said Letters Patent is hereby corrected as shown below:

Col. 8, line 49, Claim 1, after "respect to the" insert --phase--.

Signed and Sealed this

Fifteenth Day of May, 2001

Attest:

NICHOLAS P. GODICI

Attesting Officer     Acting Director of the United States Patent and Trademark Office